(12) United States Patent
Melzner

(10) Patent No.: US 7,844,936 B2
(45) Date of Patent: Nov. 30, 2010

(54) METHOD OF MAKING AN INTEGRATED CIRCUIT HAVING FILL STRUCTURES

(75) Inventor: Hanno Melzner, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 528 days.

(21) Appl. No.: 11/843,270

(22) Filed: Aug. 22, 2007

(65) Prior Publication Data

US 2009/0055793 A1 Feb. 26, 2009

(51) Int. Cl.
*G06F 17/50* (2006.01)
(52) U.S. Cl. ............................................. 716/14; 716/1
(58) Field of Classification Search ................ 716/1, 716/11, 14
See application file for complete search history.

(56) References Cited

U.S. PATENT DOCUMENTS

| | | | |
|---|---|---|---|
| 4,916,514 A | 4/1990 | Nowak | |
| 5,854,125 A | 12/1998 | Harvey | |
| 5,861,342 A | 1/1999 | Gabriel et al. | |
| 6,609,235 B2 * | 8/2003 | Ramaswamy et al. | 716/8 |
| 6,904,581 B1 * | 6/2005 | Oh | 716/10 |
| 6,913,990 B2 | 7/2005 | Nuetzel | |
| 7,152,215 B2 | 12/2006 | Smith et al. | |
| 7,458,053 B2 * | 11/2008 | Ruderer et al. | 716/10 |
| 2002/0144224 A1 * | 10/2002 | Frerichs et al. | 716/4 |
| 2002/0199162 A1 * | 12/2002 | Ramaswamy et al. | 716/8 |
| 2006/0190893 A1 | 8/2006 | Morton | |
| 2006/0246719 A1 | 11/2006 | Rueger et al. | |
| 2007/0210453 A1 * | 9/2007 | Large et al. | 257/758 |
| 2008/0010934 A1 * | 1/2008 | Rizzo et al. | 52/439 |
| 2008/0046853 A1 * | 2/2008 | Ruderer et al. | 716/10 |
| 2008/0077903 A1 * | 3/2008 | Dinter et al. | 716/11 |
| 2008/0235643 A1 * | 9/2008 | Taravade et al. | 716/9 |
| 2009/0013298 A1 * | 1/2009 | Fouad et al. | 716/11 |
| 2009/0031261 A1 * | 1/2009 | Smith et al. | 716/2 |
| 2009/0193382 A1 * | 7/2009 | Melzner et al. | 716/13 |
| 2009/0217228 A1 * | 8/2009 | Melzner | 716/10 |

OTHER PUBLICATIONS

XYALIS, GTsmooth, website: www.xyalis.com/gtsmooth.htm, printed on Mar. 29, 2007, pp. 1-6, Copyright 2006 XYALIS, Developed by iMediasoft.
The MOSIS Service, MOSIS CMP and Antenna Rules, website: http://www.mosis.org/Technical/Designrules/guidelines.html, printed on Mar. 29, 2007, pp. 1-4.

(Continued)

*Primary Examiner*—Jack Chiang
*Assistant Examiner*—Suchin Parihar
(74) *Attorney, Agent, or Firm*—Dicke, Billig & Czaja, PLLC

(57) ABSTRACT

A method for configuring an integrated circuit including configuring a plurality cells to form a cell library, wherein configuring each cell includes routing a intracell wiring in at least one layer positioned above a substrate, with the conductors being spaced apart from one another so as to have gaps there between, and configuring and positioning a plurality of fill structures in the gaps. The method further includes arranging selected logic cells from the cell library to form a desired layout of the integrated circuit, routing interconnect wiring between the selected logic cells in the at least one layer, and removing fill structures at positions that conflict with the routing of the interconnect wiring.

15 Claims, 10 Drawing Sheets

OTHER PUBLICATIONS

Dr. Artur Balasinski, Cypress Semiconductor and Dr. Sam Nakagawa, BLAZE DFM; Using fill synthesis for enhanced planarization (part 2), website: http://www.edadesignline.com/howto/showArticleihtmlisessionid=41CO3XIXLVX3UOS, printed on Mar. 29, 2007, pp. 1-3, Copyright 2006 CMP Media LLC.

Dr. Artur Balasinski, Cypress Semiconductor and Dr. Sam Nakagawa, BLAZE DFM; Using fill synthesis for enhanced planarization (part 2), website: http://www.edadesignline.com/howto196600473, printed on Mar. 29, 2007, pp. 1-9, Copyright 2006 CMP Media LLC.

* cited by examiner

METHOD OF MAKING AN INTEGRATED CIRCUIT HAVING FILL STRUCTURES

BACKGROUND

Integrated circuits are typically fabricated on a flat semiconductor substrate or wafer, via lithography processes, for example, and include layers of active elements, such as transistors, for example, insulating material layers, and metallization layers of active conductive traces to connect the transistors and other devices together. Maintaining the planarity of the semiconductor wafer surface during fabrication is crucial to insure that there is no accidental coupling of active conductive traces of integrated circuits on the wafer, and to reduce depth-of-focus problems by providing a surface with a constant height for subsequent lithography processes.

Chemical mechanical polishing (CMP) is one technique employed for planarizing the top surface of an in-process wafer or substrate prior to deposition of a next layer. One drawback to CMP, however, is that removal rates are different for different materials, such as oxide or copper, for example. As such, if large areas of material with high removal rates are present on the wafer surface, it will lead to non-uniform removal rates, often referred to as "dishing" and "erosion". Thus, in order to achieve a uniform average removal rate, it is important to have approximately the same average material composition over the surface of the chip and wafer. CMP requires less effort and provides better results if the average composition (i.e. spatial density of various materials) of the surface is uniform on a large scale (for example, some hundreds of microns). However, plasma etching and lithography are sensitive to even small range non-uniformities (below some microns).

One technique presently employed in attempts to achieve a uniform layer density is the addition of dummy or fill structures. Fill structures are structures that are not necessary for the main electrical functionality of a device and are positioned in spaces between active conductive traces which would otherwise be filled only with insulating material. After the active components of a layer have been configured, fill structures are laid out in the gaps or spaces by either an automated fill algorithm or by hand. Fill structures are generally metal elements which are not connected or activated, but in some instances, may be grounded (i.e. "connected").

In the upper metal layers, two types of fill are generally used: "square fills" and "track fills". Square fills are relatively large and have relatively small capacitive side effects, but do not fit effectively into many gaps and, as a result, even after filling, density uniformity is often still poor. Track fills are similar in shape to active conductive traces and generally fit better into smaller gaps than square fills. Each of these fills requires extensive calculation efforts in the chip layout, particularly for layers not having a "simple" geometry. Routing layers, such as the upper metals, are typically of simple geometry (e.g. having long parallel conductive traces) so that adding the fill is relatively easy. However, layers forming the standard logic cell wiring, such as the first metal layer, and sometimes the second metal layer, are much more complicated.

Unfortunately, for cost purposes, the acceptable calculation time available for calculating fill layouts is limited, so that fill layout solutions created by automated fill algorithms are generally sub-optimal and do not achieve the quality of a hand-drawn layout or even the quality of automated layout solutions resulting from fill algorithms having long calculation times. Additionally, the electrical effect of fills on the integrated circuit can, at best, be only approximately anticipated and may lead to unexpected timing problems.

SUMMARY

In one embodiment, a method is provided for making an integrated circuit. The method includes configuring a plurality of cells to form a cell library, wherein configuring each cell includes routing a intracell wiring in at least one layer positioned above a substrate, with the conductors being spaced apart from one another so as to have gaps there between, and configuring and positioning a plurality of fill structures in the gaps. The method further includes arranging selected logic cells from the cell library to form a desired layout of the integrated circuit, routing interconnect wiring between the selected logic cells in the at least one layer, and removing fill structures at positions that conflict with the routing of the interconnect wiring.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, a method of configuring fill structures in an integrated circuit is described herein which provides improved uniformity in average layer density and enables improved planarity for processes such as plasma etching and lithography, for example.

An integrated circuit (IC) logic cell generally consists of a pre-designed layout of transistors or non-specific collection of logic gates which are typically arranged using some type of computer aided design (CAD) application. A plurality of such IC logic cells, each having a unique configuration and/or logical function, is referred to as a cell library. To form an IC, such as an application specific IC (ASIC), logic cells are selected from the cell library and arranged in a desired layout and interconnected or wired together so as to achieve the desired operation. Typically, the layout and wiring is performed using an automated CAD placement and routing tool.

According to conventional techniques, as described above, after the logic cells are interconnected, fill structures are laid out in the gaps between the conductive traces or wires. Again, CAD fill tools are often employed to automatically place fill structures in the gaps according to a set of design rules (e.g. size, shape, spacing between structures, etc.). However, these techniques generally achieve less than ideal results, particularly in layers forming the standard logic cell wiring, such as the first metal layer (M1).

Figure 1:
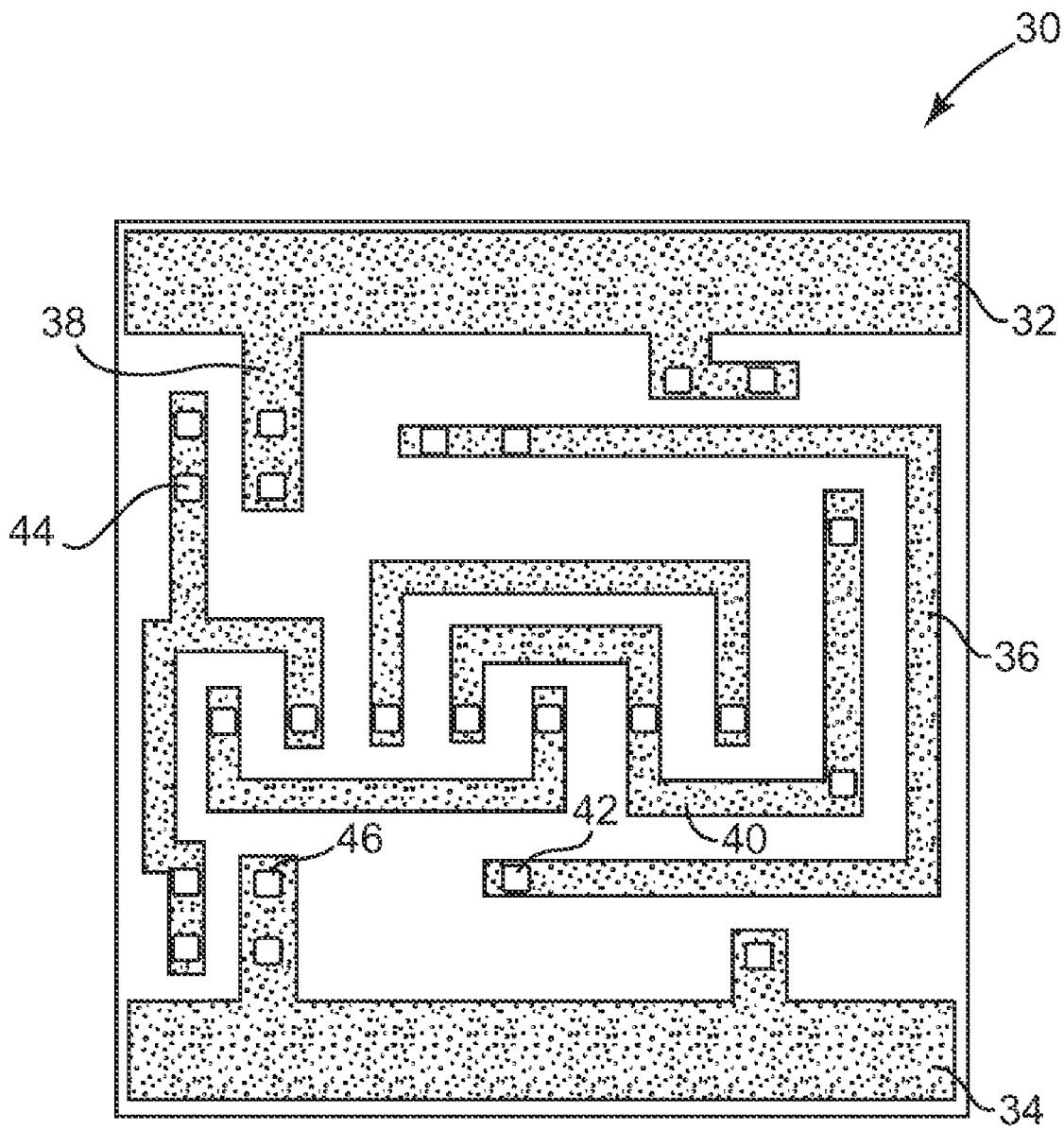
FIG. 1 is a block diagram illustrating a physical layout of an example semiconductor cell.

FIG. 1 is a schematic diagram illustrating one embodiment of a physical layout of active wiring or conductive traces in an M1 layer of an example library logic cell 30. Power (VDD) and ground (VSS) rails 32 and 34 extend across opposite edges of logic cell 30. Conductive traces, such as those illustrated at 36, 38, and 40, couple the M1 layer to active areas of transistors (e.g. source, gates, drains) which are positioned below the M1 layer (e.g. in a substrate). For ease of illustration and clarity, the transistors are not shown in the Figures herein.

Square structures, such as structures 42, 44, and 46, represent contact holes that vertically connect M1 to source drain, and gates of transistors formed below M1 layer. Similarly, although not illustrated in FIG. 1, there may be contact or via holes that vertically connect M1 to a second metal layer (M2), and so forth, in case the intracell wiring incorporates metal layers above M1.

The conductive traces, such as conductive traces 36, 38, and 40, connect the active areas of the transistors to one another, to power and ground rails 32 and 34, and to wires in higher metal layers which interconnect cells of an ASIC to one another, and to external PINS. It is noted that the conductive traces of FIG. 2, including conductive traces 36, 38, and 40, represent "standard" wiring within logic cell 30 (i.e. intracell wiring). Intercell connect wiring which, as described above, is wiring between cells of an IC and to external PINS, is not illustrated in FIG. 1.

Figure 2:
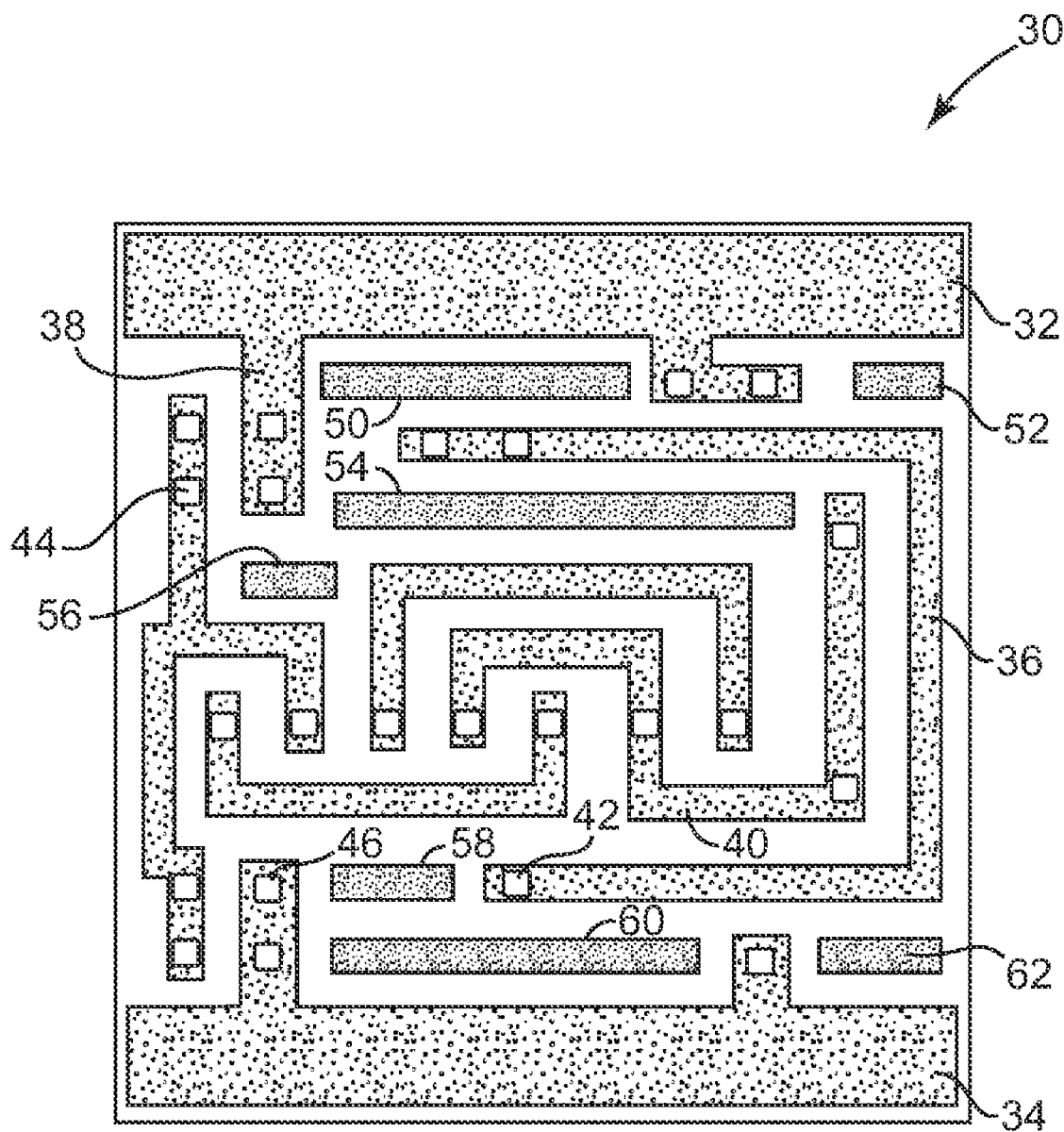
FIG. 2 is a block diagram illustrating the semiconductor cell of FIG. 1 including fill structures according to one embodiment.

FIG. 2 is a schematic diagram illustrating the physical layout of the M1 layer of logic cell 30 of FIG. 1, according to one embodiment. As illustrated by FIG. 2, in addition to the intracell wiring, such as conductive traces 36, 38, and 40, fill structures, such as fill structures 50, 52, 54, 56, 58, 60, and 62, are laid out and positioned in the gaps between intracell wiring (e.g. conductive traces 36, 38, and 40) of the M1 layer.

In one embodiment, the configuration and layout of the fill structures is performed using an automated CAD fill tool. In one embodiment, the configuration and layout of the fill structures is performed by hand. In either case, the fill structures are laid out and configured in accordance with a set of predetermined design rules.

Design rules are generally specific to a particular semiconductor manufacturing process. A design rule set specifies certain geometric and connectivity restrictions to ensure sufficient margins to account for variability in semiconductor manufacturing processes, so as to better ensure proper operation of the IC after fabrication. In one embodiment, the fill structures are configured with dimensions (e.g. lengths and width) substantially similar to dimensions of the conductive traces. Configuring fill structures in this fashion generally simplifies the fabrication process. However, in other embodiments, the fill structures may be of other shapes and dimensions (e.g. squares).

While described above with respect to logic cell 30, the above described process of configuring and laying out fill structures as part of the cell design is performed for each cell in the library. The number of cells contained in a given library varies, but is often between 300 and 1,000 cells. Using the cell library consisting of cells having integral fill structures according to embodiments described herein, and in a fashion similar to that of conventional techniques, an IC, such as an ASIC, is formed by arranging selected cells from the library in a desired fashion and routing interconnect wiring between the cells to achieve the desired operational results. In one embodiment, the cell arrangement and interconnect wiring is performed using an automated CAD placement and routing tool.

Figure 3:
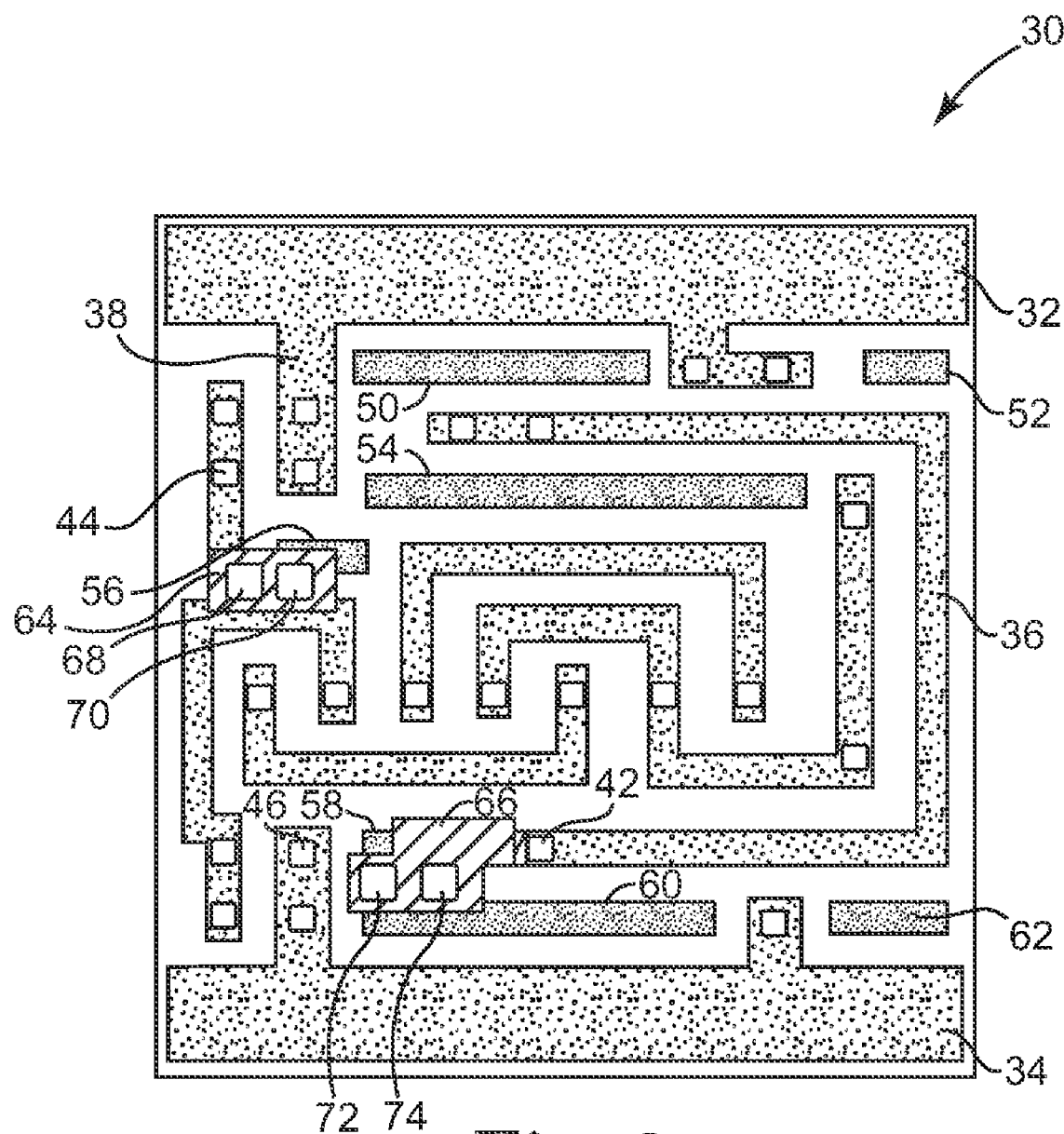
FIG. 3 is a block diagram illustrating the semiconductor cell of FIG. 2 including interconnect wiring.

FIG. 3 is a schematic diagram illustrating the physical layout of the M1 layer of logic cell 30 of FIG. 2 after being employed to form a portion of an IC and after interconnect wiring has been routed, according to one embodiment, such as by an automated CAD routing and placement tool. For ease of illustration, only logic cell 30 is shown in Figure. The cross-hatched areas at 64 and 66 represent interconnect wiring (i.e. additional metal) added to the M1 layer by the automated CAD routing tool. As illustrated by FIG. 3, interconnect wiring 64 and 66 includes the formation of landing pads for vias, indicated by the square structures at 68-74, for connection to layers positioned above the M1 layer. In one embodiment, the automated CAD routing tool ignores the locations of the fill structures 50-62 when determining the routing of the cell interconnect wiring so that routing flexibility is unchanged as compared to routing done with conventional techniques using "un-filled" cells.

In one embodiment, after completing the routing and placement of the cell interconnect wiring, the automated CAD routing tool identifies fill structures which are at positions conflicting with the cell interconnect wiring. Conflicting fill structures are removed from the cell and, thus, from the IC to ultimately be fabricated (e.g. an ASIC). With reference to FIG. 3, it can be seen that fill structure 56 conflicts with interconnect wiring 64 and that fill structures 58 and 60 conflict with interconnect wiring 60 and, thus, according to one embodiment, will need to be removed.

In one embodiment, in order to determine which of the various M1 elements can be removed, each of the various types of elements is represented by a different data type, with certain data types indicating elements that cannot be removed (e.g. intracell wiring such as conductive traces 36, 38, and 40, and contacts 42, 44, and 46). In one embodiment, for example, intracell wiring, such as conductive traces 36, 38, and 48, are represented by a first data type, and fill structures, such as fill structures 50-62, are represented by a second data type. In one embodiment, the automated CAD routing tool identifies potential conflicts between the interconnect wiring and other elements in the M1 layer, such as conductive traces 36-40 and fill structures 50-62, by comparing coordinates representative of the positions of each of the interconnect wiring elements to coordinates representative of the position of each of the other elements.

In one embodiment, when a conflict is identified, the automated CAD routing tool checks the data type of the conflicting element. If the data type of the conflicting element is representative of a fill structure, the conflicting element is removed from the cell. If the data type of the conflicting element is representative of an element other than a fill structure, such as an intracell wire (e.g. conductive traces 36, 38, and 40), the conflicting structure is not removed and a position of the inter-cell wiring may need to be adjusted (e.g. may be too close to an adjacent intracell conductive trace).

Figure 4:
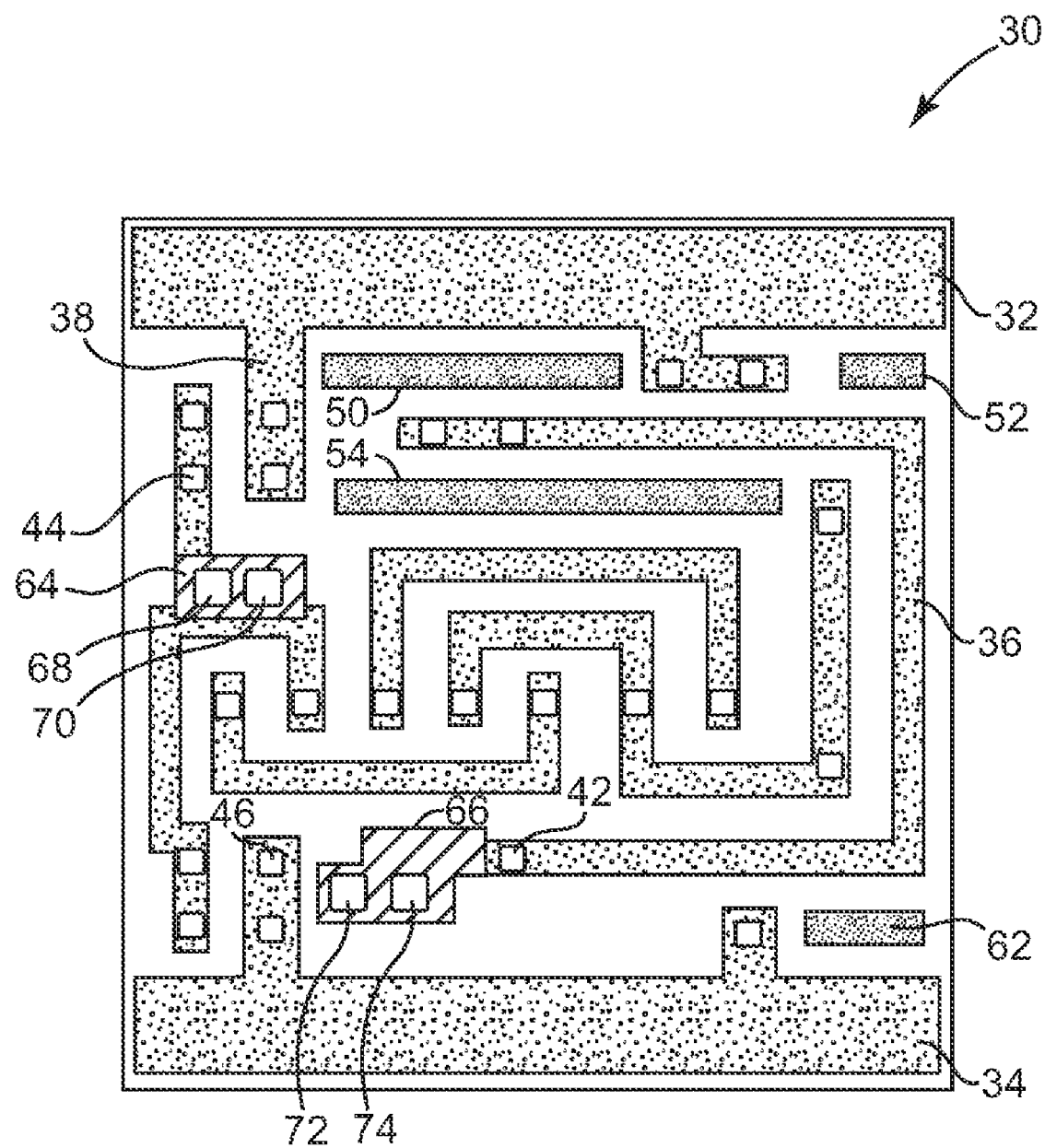
FIG. 4 is a block diagram illustrating the semiconductor cell of FIG. 3 according to one embodiment.

FIG. 4 is a schematic diagram of the physical layout of the M1 layer of logic cell 30 of FIG. 3 after fill structures 56, 58 and 60 conflicting with cell interconnect wiring 64 and 66 have been removed.

By configuring the fill structures as part of the initial layout of each of the logic cells of the cell library according to embodiments described herein, such as logic cell 30, time consuming and costly computation of fill shapes in the final configuration of the entire IC, such as an ASIC, is avoided. Because the configuration and placement of the fill structures is performed only one time for each of the relatively limited number of individual cells in the cell library, sufficient calculation time can be spent to substantially optimize the fill density/quality of each cell which, in-turn, substantially optimizes the fill quality of the entire IC, while still spending less overall computation time as compared to computing fill shapes after completion of the physical layout of the entire IC. An algorithm configured to identify and remove fill structures is simpler and less time consuming than one required to add fill structures to a full chip without creating conflicts. Additionally, even though conflicting fill structures are removed, a majority of the fill structures typically remain unchanged such that the removal of conflicting fill structures will typically be negligible.

Furthermore, even if fill structures are not physically connected to active elements in the cell (i.e. are "floating"), they can impact the electrical properties and operating characteristics (e.g. timing) of the cell via the effects of capacitive coupling. By including the fill structures in the initial cell layout, the electrical side-effects of the fill structures on the cell can be characterized in advance and fill structures which may need to be modified/removed in order to ensure better operation of the IC after fabrication can be identified. Again, since the majority of fill structures remain unchanged, removal of conflicting fill structures will have relatively minor impact on the expected electrical side effects.

Also, not only the electrical characterization of the cells be more realistic, configuring the fill structures as part of the initial cell layout enables improved lithography simulation. Lithography simulation is employed to foresee whether the shape of the drawn features, including the fill structures, will result in excessive distortion (referred to as "bridging" or "pinching") during the optical imaging process. The inclusion of fill shapes in the simulation enables such distortions to be detected during cell design and fixed (e.g. change fills structure dimensions) before the IC is fabricated.

It is also noted that, although described above primarily with respect to the M1 layer of logic cell 30, the embodiments described above can be applied to other layers of logic cell 30 as well, including upper metal layers, such as the second metal layer (M2), for example. Additionally, although described and illustrated above with fill structures which are of a "track" style, fill structures of other shapes (e.g. squares) may be used.

Figure 5:
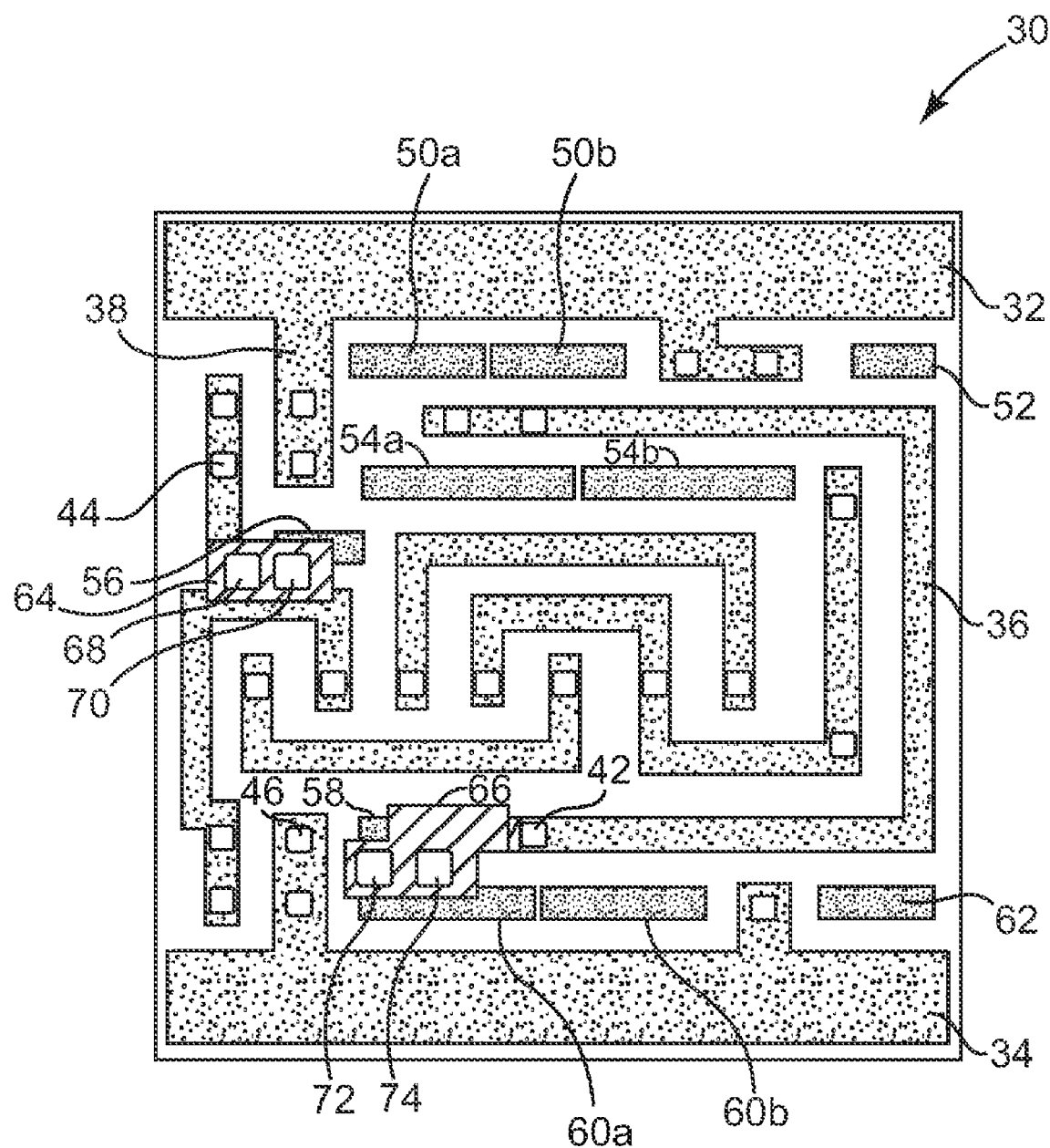
FIG. 5 is a block diagram illustrating the semiconductor cell of FIG. 1 including fill structures according to another embodiment.

FIG. 5 is a schematic diagram illustrating the physical layout of the M1 layer of logic cell 30 after being employed to form a portion of an IC and after interconnect wiring has included and routed, similar to that illustrated by FIG. 3, but including fill structures configured according to another embodiment. As illustrated by FIG. 5, in lieu of each fill structure 50-62 being configured as a contiguous structure, selected fill structures are configured as a plurality of fill sub-structures.

As illustrated by FIG. 5, fill structures 50, 54, and 60 are respectively configured as fill sub-structures 50a and 50b, 54a and 54b, and as 60a and 60b. Each of the fill sub-structures is configured so as to be in accordance with the predetermined design rules. As such, only fill structures having dimensions which enable segmentation into at least two fill sub-structures meeting the predetermined design rules are segmented into fill structures. By segmenting fill structures into fill sub-structures when possible, only those fill structures and fill substructures conflicting with cell interconnect wiring are removed. With reference to FIG. 5, it can be seen that fill structure 56 conflicts with interconnect wiring 64 and that fill structure 58 and fill sub-structure 60a conflict with interconnect wiring 66.

Figure 6:
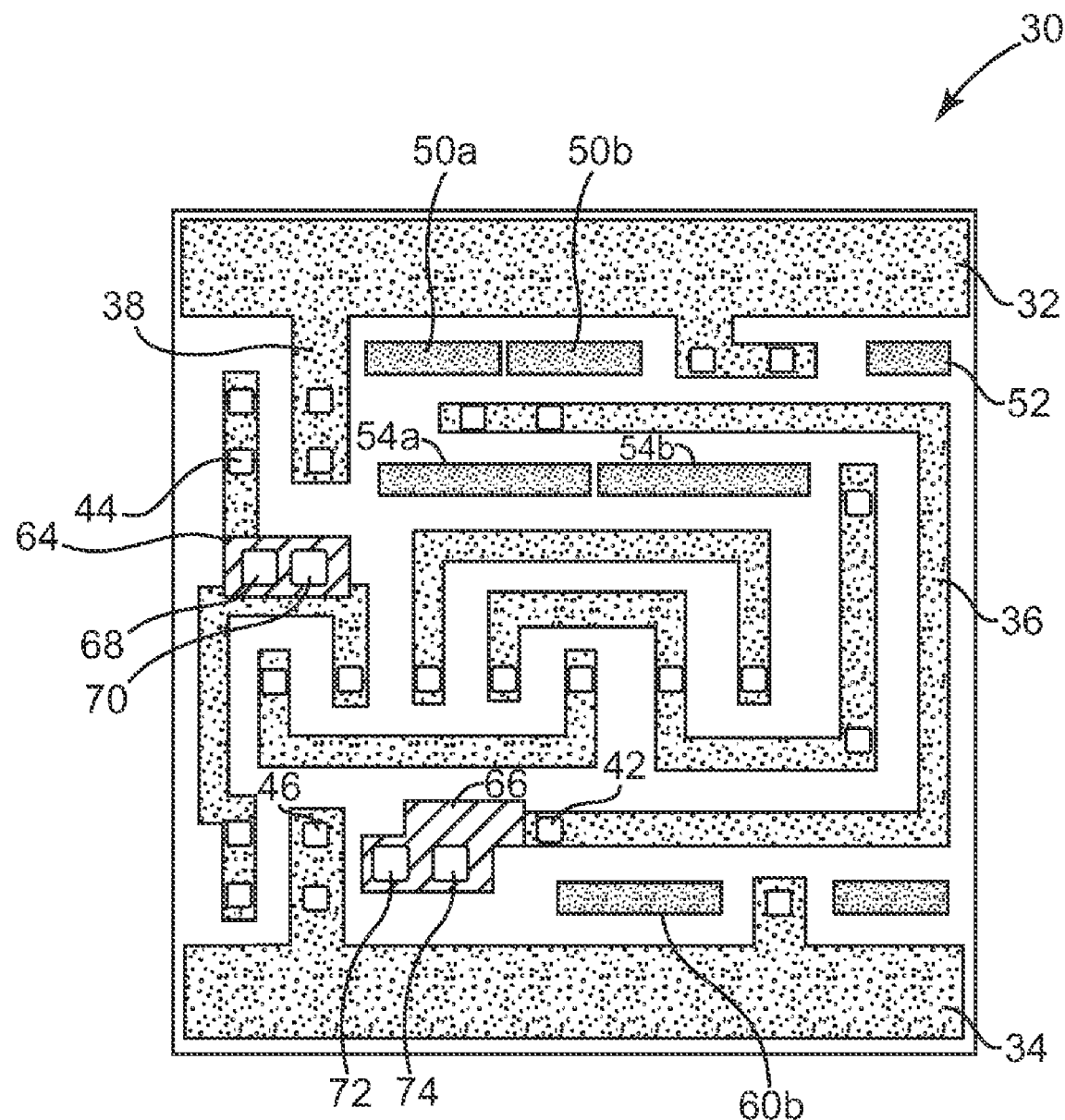
FIG. 6 is a block diagram of the semiconductor cell of FIG. 5 according to one embodiment.

FIG. 6 is a schematic diagram of the physical layout of the M1 layer of logic cell 30 of FIG. 5 after fill structures 56 and 58 and fill sub-structure 60a conflicting with cell interconnect wiring 64 and 66 have been removed. By segmenting fill structure 60 into fill sub-structures 60a and 60b, only fill sub-structure 60a is removed for conflicting with cell interconnect wiring placed by the automated CAD routing tool. As such, with further reference to FIG. 4, a greater portion of the fill structures 50-62 laid out as part of the "standard" library cell configuration remain intact after placement of the cell inter-connect wiring, thereby further improving the fill quality/density of the IC of which logic cell 30 is a part. Furthermore, because even smaller portions of the fill structures are removed as compared to that illustrated by FIG. 4, the change in electrical behavior of the cell by removing conflicting fill structures compared to the pre-characterization will be even smaller.

Figure 7:
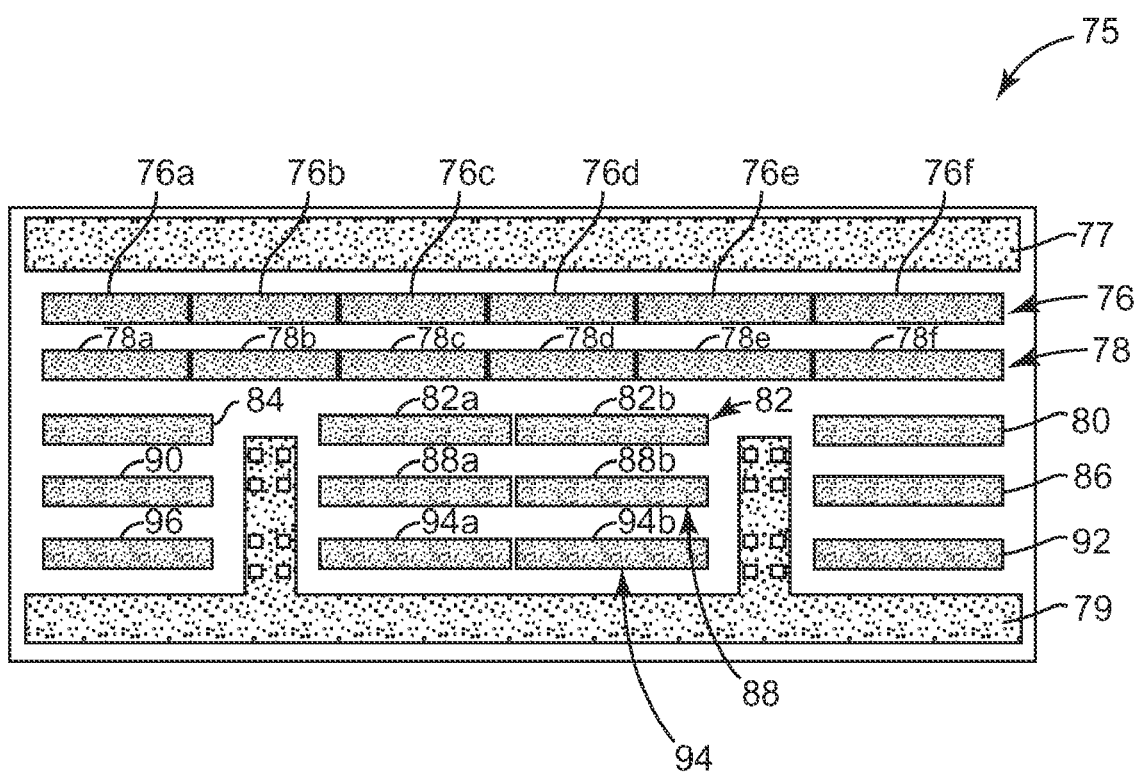
FIG. 7 is a block diagram illustrating the semiconductor cell including fill structures according to one embodiment.

FIG. 7 is a schematic diagram of the physical layout of the M1 layer of a cell 75, according to one embodiment, which may be part of a same cell library as cell 30 of FIG. 1. Cell 75 includes power (VDD) and ground (VSS) rails 77 and 79, but otherwise includes no intracell wiring and is not configured to perform any logic function. Cell 75 is sometimes referred to as a fill cell and is positioned in gaps between logic cells of an IC, such as logic cell 30 of FIG. 1, so as to maintain continuity of the power and ground rails in the IC.

According to one embodiment, as illustrated by FIG. 7, fill structures 76, 78, 80, 82, 84, 86, 88, 90, 92, 94, and 96 are configured and positioned in open spaces of cell 75 according to a set of predetermined design rules, with fill structure 76 being segmented into fill sub-structures 76a-76f, fill structure 78 being segmented into fill sub-structures 78a-78f, fill structure 82 being segmented into fill sub-structures 82a-82b, fill structure 88 being segmented in fill sub-structures 88a-88b, and fill structure 94 being segmented into fill sub-structures 94a-94b.

Figure 8:
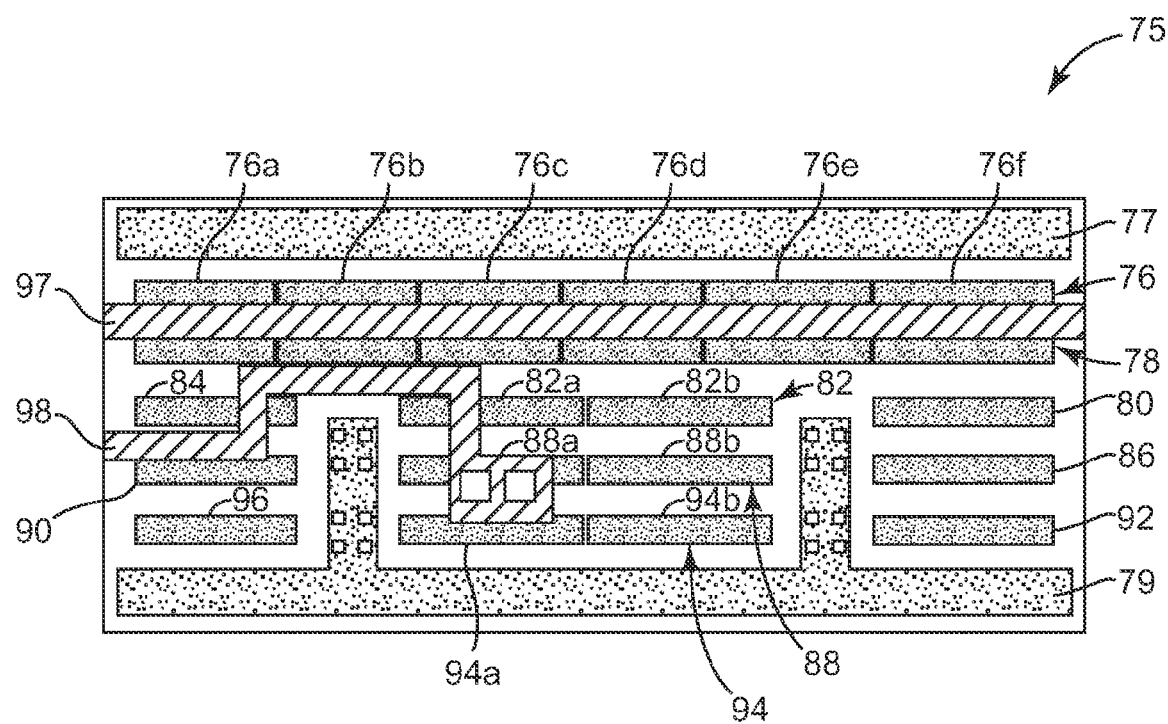
FIG. 8 is a block diagram illustrating the semiconductor cell of FIG. 7 including interconnect wiring.

FIG. 8 is a schematic diagram illustrating the physical layout of the M1 layer of cell 75 of FIG. 7 after being positioned to form a portion of an IC and after interconnect wiring has been routed, such as by an automated CAD routing tool.

The cell interconnect wiring is illustrated by the cross-hatched elements 97 and 98. As can be seen in FIG. 8, all of the fill sub-structures 76a-76f and 78a-78f conflict with interconnect wiring 97, while fill structures 84 and 90 and fill sub-structures 82a, 88a, and 94a conflict with interconnect wiring 98.

Figure 9:
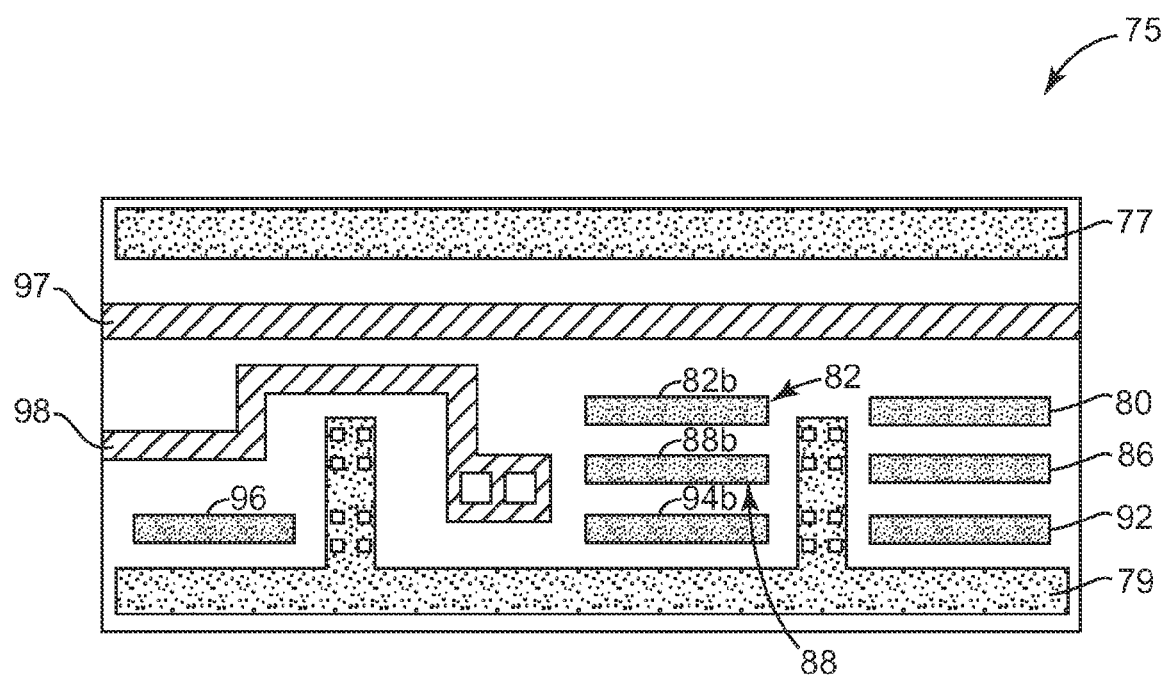
FIG. 9 is a block diagram of the semiconductor cell of FIG. 8 according to one embodiment.

FIG. 9 is a schematic diagram illustrating the physical layout of the M1 layer of cell 70 of FIG. 7 after the fill structures and fill sub-structures conflicting with interconnect wiring 97 and 98 have been removed.

Figure 10:
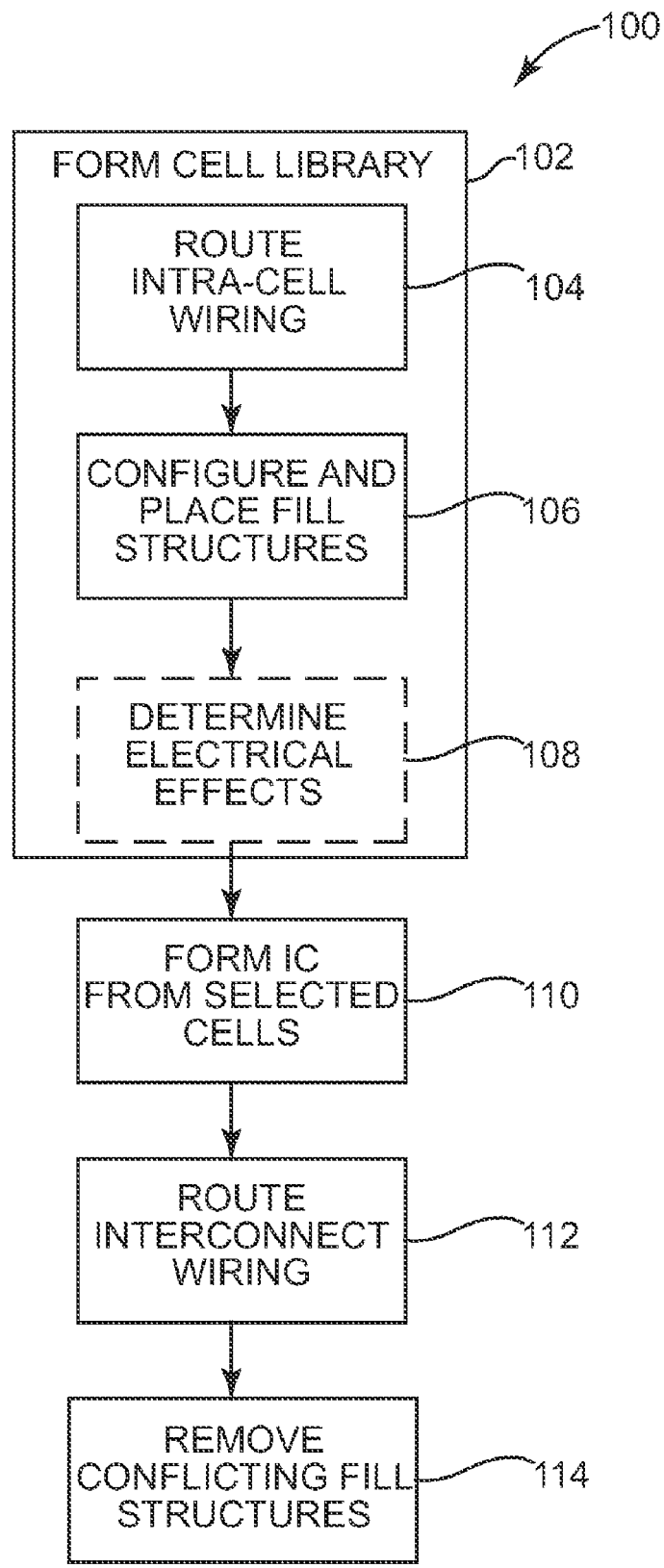
FIG. 10 is a flow diagram illustrating one embodiment of a method for configuring an integrated circuit.

FIG. 10 is a flow diagram illustrating one embodiment of a process 100 for configuring an integrated circuit having fill structures. Process 100 begins at 102 with configuring a plurality of cells to form a cell library. In one embodiment, the configuring of each cell includes routing intracell wiring in at least one layer positioned above a substrate, with the conductors spaced apart from one another so as to have gaps there between, as indicated at 104, and configuring and positioning a plurality of fill structures in the gaps, as indicated at 106. In one embodiment, the intracell wiring and fill structures comprise a same material (e.g. copper, aluminum). In one embodiment, the intracell wiring and fill structures are routed in a first metallization layer (Metal-1). In one embodiment, the intracell wiring and fill structures are configured according to set of predetermined design rules, similar to that described above with respect to FIGS. 1-4. In one embodiment, the fill structures are segmented into fill sub-structures, similar to that described above with respect to FIGS. 5-7. In one embodiment, the fill structures are configured and laid out by hand. In one embodiment, the fill structures are configured by an automated fill tool.

In one embodiment, process 100 optionally includes determining the electrical side-effects (e.g. coupling capacitance) and operational effects of the fill structures on the cell, as indicated by the dashed lines at 108.

At 110, individual cells are selected from the cell library formed at 102 and arranged to form a desired layout of the integrated circuit (e.g. chip). At 112, interconnect wiring is routed between the selected logic cells at least partially in the at least one layer of up to all cells forming the desired layout of the integrated circuit. At 114, fill structures and/or fill sub-structures at positions which conflict with the interconnect wiring routed at 112 are removed, similar to that described above with respect to FIGS. 1-4.

It will be understood by a person of ordinary skill in the art that the methods of configuring an integrated circuit as described herein, including the configuring and positioning of fill structures, such as illustrated by process 100 of FIG. 10, for example, may be implemented in hardware, software, firmware, or any combination thereof. The implementation may be via a microprocessor, programmable logic device, or state machine. Components of the present invention may reside in software on one or more computer-readable mediums. The term computer-readable medium as used herein is defined to include any kind of memory, volatile or non-volatile, such as floppy disks, hard disks, CD-ROMs, flash memory, read-only memory, and random access memory.

Additionally, although fill structures have been described primarily herein as not being physically connected to active elements in the cell, it is noted that the embodiments described herein can be applied to grounded or active fill structures as well. Furthermore, in one embodiment, as an alternative to providing independent fill structures, the active traces in the cells may be extended (i.e. made longer) or made wider (i.e. thicker) than required to "fill" spaces, with these additional portions of the conductive traces being assigned a different data type similar to that described above with regard to independent fill structures. Additional portions of the conductive traces conflicting with later routed interconnect wiring are removed in a fashion similar to that described above for fill structures. However, such an approach has some drawbacks such as high capacitance and crosstalk, to name a few.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for configuring an integrated circuit, the method comprising:
    configuring a plurality of cells to form a cell library for use with a processing system, wherein configuring each cell includes:
        routing intracell wiring in at least one layer positioned above a substrate, the conductors spaced apart from one another so as to have gaps there between; and
        configuring and positioning a plurality of fill structures in the gaps;
    selecting, with the processing system, cells from the library for use in formation of the integrated circuit;
    arranging, with the processing system, the selected logic cells to form a desired layout of the integrated circuit;
    routing, with the processing system, interconnect wiring between the selected logic cells in the at least one layer; and
    removing, with the processing sytem, fill structures at positions that conflict with the routing of the interconnect wiring.

2. The method of claim 1, wherein configuring the plurality of fill structures includes partitioning selected fill structure into a plurality of fill sub-structures, and wherein removing fill structures includes eliminating only those fill sub-structures at positions that conflict with the routing of the interconnect wiring.

3. The method of claim 1, wherein configuring and positioning the plurality of fill structures includes laying out each of the fill structures in conformance with a set of design rules.

4. The method of claim 1, wherein configuring and positioning the plurality of fill structures includes using an automated fill tool.

5. The method of claim 1, wherein configuring and positioning the plurality of fill structures is performed manually without the aid of the processing system.

6. The method of claim 1, wherein the at least one layer comprises a first metal layer.

7. The method of claim 1, wherein the intracell wiring is represented by a first data type and the fill structures are represented by a second data type.

8. The method of claim 1, wherein forming each cell includes approximating an effect of the fill structures on electrical and lithographic characteristics of the cell.

9. The method of claim 1, wherein configuring and positioning the fill structures includes shaping the fill structures so as to have a shape similar to that of the intracell wiring and interconnect wiring.

10. The method of claim 1, wherein the fill structures comprise a same material as the intracell wiring and the interconnect wiring.

11. A method of making an integrated circuit, the method comprising:
- configuring a plurality of cells to form a cell library for use with a processing system, wherein configuring each cell includes:
  - routing, with the processing system, intracell wiring in at least one layer positioned above a substrate; and
  - configuring and positioning, with the processing system, a plurality of fill structures in gaps between the intracell wiring;
- selecting, with the processing system, cells from the library for use in formation of the integrated circuit;
- arranging the selected logic cells to form a desired layout of the integrated circuit;
- routing interconnect wiring between the selected logic cells in the at least one layer; and
- removing fill structures conflicting with the interconnect wiring.

12. The method of claim 11, wherein configuring and positioning the plurality of fill structures includes segmenting selected fill structures of the plurality of fill structures into a corresponding plurality of fill sub-structures, and wherein removing fill structures includes removing only those fill-substructures of the fill structure conflicting with the interconnect wiring.

13. The method of claim 11, wherein configuring and position the fill structures and fill sub-structures is in accordance with a set of design rules.

14. A non-transitory computer-readable medium having computer-executable instructions for configuring an integrated circuit, which when executed by a computer, perform the method comprising:
- configuring a plurality of cells to form a cell library, wherein configuring each cell includes:
  - routing intracell wiring in at least one layer positioned above a substrate, the conductors spaced apart from one another so as to have gaps there between; and
  - configuring and positioning a plurality of fill structures in the gaps;
- selecting cells from the library for use in formation of the integrated circuit;
- arranging the selected logic cells to form a desired layout of the integrated circuit;
- routing interconnect wiring between the selected logic cells in the at least one layer; and removing fill structures at positions that conflict with the routing of the interconnect wiring.

15. A method of making an integrated circuit, the method comprising:
- laying out, with a processing system, fill structures in gaps between intracell wiring in at least one layer of each cell of a cell library, wherein the at least one layer is the same layer in each cell;
- selecting, with the processing system, cells from the library for use in formation of the integrated circuit;
- arranging, with the processing system, the selected cells to form a desired layout of the integrated circuit;
- routing, with the processing system, interconnect wiring between the selected cells forming the desired layout so as to enable a desired logical operation of the integrated circuit; and
- removing, with the processing system, fill structures from the selected cells forming the desired layout which are at positions conflicting with the interconnect wiring.

* * * * *